(12) United States Patent
Ryan

(10) Patent No.: US 6,172,893 B1
(45) Date of Patent: Jan. 9, 2001

(54) DRAM WITH INTERMEDIATE STORAGE CACHE AND SEPARATE READ AND WRITE I/O

(75) Inventor: Kevin J. Ryan, Eagle, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/225,970

(22) Filed: Jan. 5, 1999

(51) Int. Cl.[7] ................................................ G11C 15/00
(52) U.S. Cl. ...................................... 365/49; 365/230.01
(58) Field of Search ..................... 365/189.05, 230.01, 365/49

(56) References Cited

U.S. PATENT DOCUMENTS 5,625,593 * 4/1997 Kimura ........................... 365/189.05
5,625,780 * 4/1997 Hsieh et al. ......................... 395/311

OTHER PUBLICATIONS

"400 Mb/s/pin SLDRAM, 4M×18 SLDRAM, Pipelined, Eight Bank, 2.5V Operation", *SLDRAM Inc.*, Draft/Advance, SLD4M18DR400, 4 MEG×18 SLDRAM, pp. 1–69, (1998).

"Draft Standard for a High–Speed Memory Interface (SyncLink)", *The Institute of Electrical and Electronics Engineers, Inc*, Draft 0.99 IEEE P1596.7–199X, pp. 1–55, (1996).

"New NEC Memory Technology Increase Performance by 20%", http://www.nb–pacifica.com/headline/newnecmemorytechnolo_1144.sh, pp. 1–2, (1997).

"Virtual Channel Memory", *NEC Electronics Inc.*, pp. 1–2, (1997).

Gillingham, P., "SLDRAM Architectural and Functional Overview", *The SLDRAM Consortium*, pp. 1–14, (Aug. 1997).

* cited by examiner

*Primary Examiner*—David Nelms
*Assistant Examiner*—M. Tran
(74) *Attorney, Agent, or Firm*—Schwegman, Lundberg, Woessner & Kluth, P.A.

(57) ABSTRACT

A memory device which includes intermediate storage, or cache, and unidirectional data paths coupling the intermediate storage to external input/output. The invention improves the response of the memory device by eliminating dual latencies associated with the transition from a write request to a read request. The method of use of the invention and systems incorporating the invention are further described.

33 Claims, 9 Drawing Sheets

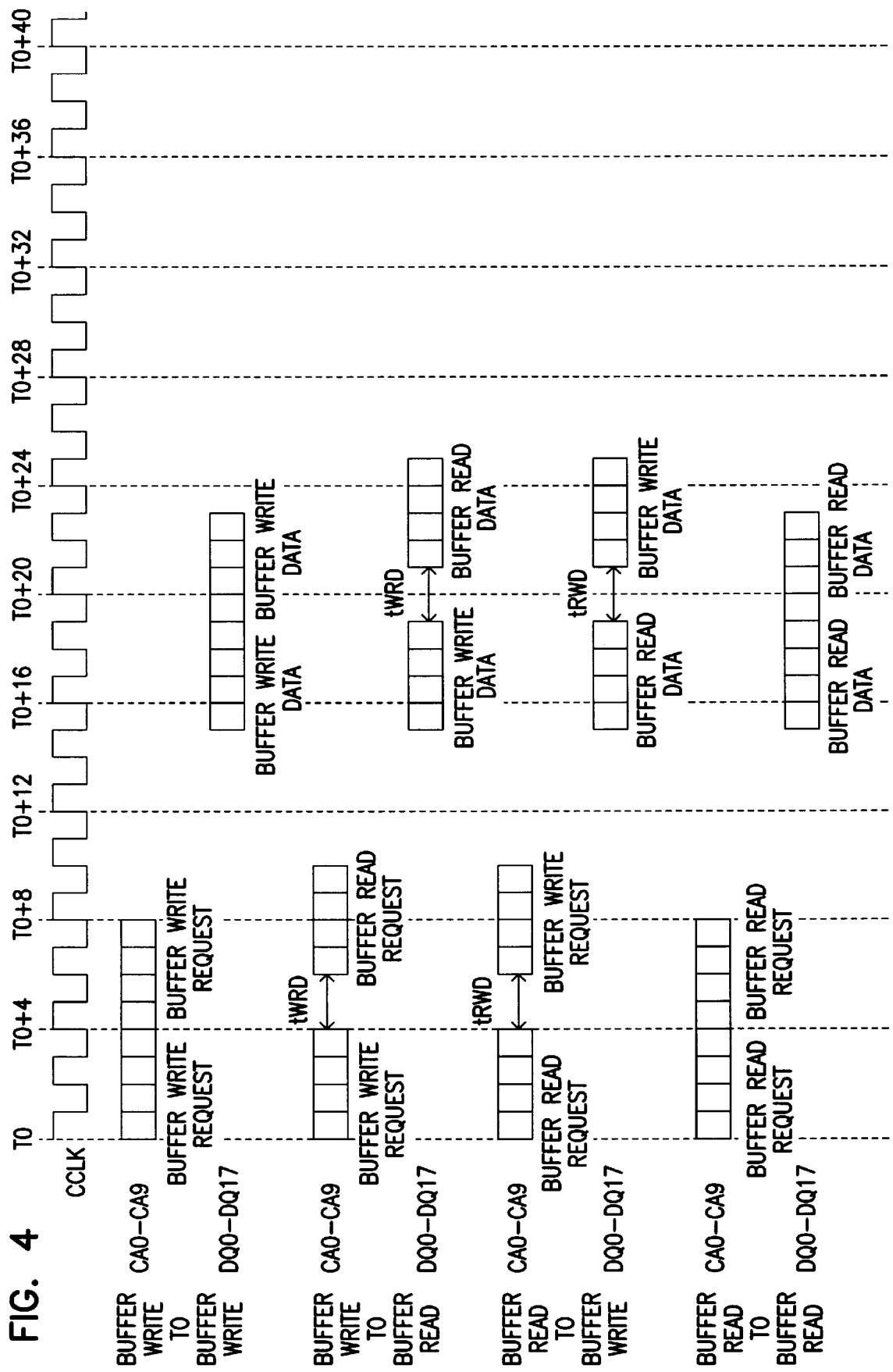

DRAM WITH INTERMEDIATE STORAGE CACHE AND SEPARATE READ AND WRITE I/O

TECHNICAL FIELD OF THE INVENTION

The present invention relates generally to memory structures and in particular the present invention relates to dynamic random access memory (DRAM) devices with intermediate storage, or cache, and separate read and write input/output (I/O) data paths.

BACKGROUND OF THE INVENTION

The performance of computer systems, especially personal computers, has improved dramatically due to the rapid growth in computer architecture design and in particular to the performance of computer memory.

Computer processors and memories, however, have not pursued the same pace of development through the years. Memories are generally not able to deliver enough response speed to processors. Different approaches have been taken to reduce the gap in speed between the processors and memories. One such approach is the concept of memory hierarchy. A memory hierarchy comprises a number of different memory levels, sizes and speeds. Small amounts of fast cache memory, usually static random access memory (SRAM), are utilized in or near the processor for data that is frequently accessed, such as program instructions. The cache memory reduces the need to access main memory by temporarily storing this frequently accessed data. More space-efficient, but slower, dynamic random access memory (DRAM) can then be utilized downstream from the cache memory. This approach has been augmented by the combination of some sort of cache memory and main memory in a single memory device.

Another approach is to improve the internal response time of the memory itself. At one time, the most common version of DRAM was Fast Page Mode (FPM) DRAM. The capabilities of FPM DRAM lag far behind today's processor speeds. Extended Data-Out (EDO) DRAM was an improvement on FPM DRAM, improving page read cycle times. The primary differences between EDO DRAM and FPM DRAM is that EDO DRAM does not turn off the output drivers when CAS# (column address strobe complement) goes HIGH, and data is valid on the falling edge of CAS# such that the edge can be used to strobe data.

Synchronous DRAM (SDRAM) was a further improvement to dynamic memory devices. SDRAM added a clocked synchronous interface, multiple internal bank arrays and programmable burst inputs and outputs. Double Data Rate (DDR) DRAM allowed data clocking on both clock edges and added a return clock. Despite these advances, SDRAM and DDR are still less than optimal to support current computer processors.

One effort to increase the capabilities of DRAM is SyncLink Dynamic Random Access Memory (SLDRAM). SLDRAM is designed to be a general purpose high performance DRAM and the protocol is targeted to be formalized as an open standard by IEEE (Institute of Electrical and Electronics Engineers, Inc.). As of the date of filing, the latest revision of the proposed IEEE standard is draft 0.99 of IEEE P1596.7-199X, *Draft Standard for a High-Speed Memory Interface(SyncLink)*, dated Oct. 14, 1996.

FIGS. 1A and 1B combined are a functional block diagram of an existing memory device 10 incorporating the features previously described. The memory device 10 is depicted as a 144M SLDRAM (i.e., an SLDRAM having $144 \times 2^{20}$ bits of memory), although the discussion is generally applicable to other sizes, configurations and types of memory. For additional background on SLDRAM of the type depicted in FIGS. 1A and 1B, please refer to the SLDRAM, Inc. document CORP400.P65, SLD4M18DR400, 4 MEG×18 SLDRAM, revision Jul. 9, 1998, which is incorporated herein by reference.

The memory device 10 includes bank memory arrays 22 which contain memory cells organized in rows and columns for storing data. Bank memory arrays 22 are depicted as eight bank memory arrays, bank0 through bank7. In memory device 10, each bank memory array 22 is organized internally as 2048 rows by 128 columns by 72 bits. Those skilled in the art will recognize that different choices for the number of banks, rows and columns, and the bit width, are possible without altering the fundamental operation of the memory devices described herein.

An external differential command clock (CCLK and CCLK#) signal is provided to clock dividers and delays 20 to generate clock signals ICLK (internal command clock), RCLK (read clock), WCLK (write clock) and other internal clock signals. Command input signals are effectively sampled at each crossing of internally delayed versions of CCLK/CCLK#.

A FLAG signal is supplied to command and address capture 24 to indicate that a valid request packet is available on pins CA0–CA9. Pins CA0–CA9 supply the address and command bits and may collectively be referred to as the command link. Command decoder and sequencer 26 acts to place the control logic in a particular command operation sequence according to the request packet received at command and address capture 24. Command decoder and sequencer 26 controls the various circuitry of memory device 10 based on decoded commands, such as during controlled reads to or writes from bank memory arrays 22. During write transfer operations, data is supplied to memory device 10 via input/output pins DQ0–DQ17. During read transfer operations, data is clocked out of memory device 10 via input/output pins DQ0–DQ17. The DQ pins can collectively (when looking external of the device) or individually (when looking internal to the device) be referred to as data links. For a read access, differential data clocks (DCLK0/DCLK0# and DCLK1/DCLK1#) are clocked out of memory device 10 via input/output pins DCLK0, DCLK0#, DCLK1 and DCLK1#. For a write access, differential data clocks (DCLK0/DCLK0# and DCLK1/DCLK1#) are driven externally, e.g. by a memory controller (not shown), and provided to memory device 10 via input/output pins DCLK0, DCLK0#, DCLK1 and DCLK1#.

Power-up and initialization functions of the memory device 10 are conducted in the conventional manner. Moreover, refresh functions of the memory device 10 are provided in the known manner employing a refresh counter 38 to refresh the memory arrays.

During a bank access command, address sequencer 28 generates a value representing the address of the selected bank memory array 22, as indicated by bank address bits on input pins CA0–CA9, and latches it in bank address register 44. Address sequencer 28 further generates a value representing a row address of the selected bank memory array 22, as indicated by row address bits on input pins CA0–CA9, and latches it in a row address register 42. Address sequencer 28 still further generates a value representing a column address, as indicated by column address bits on input pins CA0–CA9, and latches it in column select 62.

The latched row address is provided to a row multiplexer 46 which provides a row address to predecoder 48 to be provided to bank row selects 52. In addition, bank address register 44 provides the latched bank address to bank control logic 54 which in turn provides a bank address to bank row selects 52. In response to the bank address and row address, bank row selects 52 activate the desired row of the desired memory bank for processing, to thereby activate the corresponding row of memory cells. Bank row selects 52 generally have a one-tone relationship with bank memory arrays 22.

In the memory device 10 of FIGS. and 1B, column select 62 activates 72 of the 128×72 (number of columns x bit width) lines provided to sense amplifiers and I/O gating circuit 66, the number of lines activated corresponding to the bit width of the device. The lines provided to sense amplifiers and I/O gating circuit 66 represent bidirectional data paths. As used herein, paths will generally describe transmission lines internal to a memory device, while links will be used to describe lines or ports generally designed for transmission between a memory device and an external device. Sense amplifiers associated with bank memory arrays 22 operate in a manner known in the art to sense the data stored in the memory cells addressed by the active bank row select line. Activating the column select lines effectively couples, via the I/O gating circuit 66, the selected memory cells to the data paths to/from the input/output pins DQ0–DQ17.

During page read command operations, data is provided to read latch 68 from I/O gating circuit 66 as a 72-bit data word across 72 bidirectional data paths. Multiplexer 70 in turn provides the selected 72 bits of data to read FIFO 72 as a burst of four 18-bit data words, through methods such as time division multiplexing. The four data words are then driven sequentially to input/output pins DQ0–DQ17 by drivers 74. Data into read FIFO 72 is controlled by the RCLK signal generated by clock dividers and delays 20. Data out of read FIFO 72 is controlled by the delayed RCLK signal generated by programmable delay 73. Circuitry thus described and provided between DQ0–DQ17 and I/O gating circuit 66 can collectively be referred to as output circuitry and facilitates unidirectional output data paths to the data links. During page write command operations, data is provided on input/output pins DQ0–DQ17 to receivers 76 as a burst of four 18-bit data words which are individually stored in input registers 78. The four 18-bit words of input write data are provided to write FIFO 80 as a 72-bit data word and latched in write latch and drivers 82. Data into write FIFO 80 is controlled by clock generation 79 in response to external signals DCLK0/DCLK0# and DCLK1/DCLK1#. Data out of write FIFO 80 is controlled by the WCLK signal generated by clock dividers and delays 20. Write latch and drivers 82 provide the 72-bit data word across 72 bidirectional data paths to the selected row of the selected bank memory array 22 with sense amplifiers and I/O gating circuit 66 in a manner known in the art based on the activated 72 lines corresponding to the current column address. Circuitry thus described and provided between DQ0–DQ17 and the I/O gating circuit 66 can collectively be referred to as input circuitry and facilitates unidirectional input data paths from the data links.

It will be observed that data paths internal to a memory device are generally some multiple of the number of DQ pins, the multiplier increasing as the paths lead to the memory arrays.

A difficulty of the memory device 10 of FIGS. 1A and 1B occurs during a transition from a page write to a page read command operation. Memory device 10 requires a significant latency between page write requests and page read requests due to the bidirectional nature of input/output lines DQ0–DQ17 and I/O gating circuit 66.

FIG. 2 depicts a timing diagram of the memory device 10 of FIGS. 1A and 1B in response to various requests. FIG. 2 is based on a time $t_0$ representing the time of the first request and a scale representing the number of clock ticks from time $t_0$, where there are two clock ticks for each clock cycle. As shown in FIG. 2, although back-to-back page read requests and back-to-back page write requests can be accommodated, transitions between page write and page read commands require a latency. In the case of transitioning from a page read request to a page write request, this read-to-write latency ($t_{RWD}$) represents the time required to allow an external data bus to settle and, in most cases, is one cycle of CCLK or two ticks. For a 200 MHz clock, this represents about 5 ns. In the case of transitioning from a page write request to a page read request, additional latency is required to move the write data from DQ0–DQ17 to the bank memory arrays 22 before moving the read data from the bank memory arrays 22 to DQ0–DQ17. The write-to-read latency ($t_{WRD}$) can be significant and is expected to be about nine cycles of CCLK, or 18 ticks, for the memory device 10. For a 200 MHz clock, this represents about 45 ns.

It has been proposed by others that $t_{WRD}$) can be reduced by providing separate read and write data paths from the array to the input/output pins. While the improvement is desirable, it comes at a high cost, i.e., a significant penalty in die real estate and cost due to the vast duplication of circuitry and long metal runs.

For the reasons stated above, and for other reasons stated below which will become apparent to those skilled in the art upon reading and understanding the present specification, there is a need in the art for more efficient memory structures.

SUMMARY OF THE INVENTION

The above-mentioned problems with memory devices and other problems are addressed by the present invention and which will be understood by reading and studying the following specification.

The invention provides a memory device having unidirectional data paths internal to the device. In one embodiment, the unidirectional data paths extend from the I/O pins to segment buffers acting as an intermediate storage. In this embodiment, bidirectional I/O extends from the intermediate storage to the sense amplifiers of the memory arrays.

In a further embodiment, the invention provides a semiconductor die having a memory device contained thereon having unidirectional data paths and intermediate storage internal to the memory device. In a still further embodiment, the invention provides a circuit module having a memory device contained therein having unidirectional data paths and intermediate storage internal to the memory device.

In another embodiment, the invention provides an electronic system having a memory device contained therein having unidirectional data paths and intermediate storage internal to the memory device.

In yet another embodiment, the invention provides a method of accessing data contained in a memory device having unidirectional data paths and intermediate storage internal to the memory device.

BRIEF DESCRIPTION OF THE DRAWINGS

FIG. 4 is a timing diagram of the memory device of FIGS. 3A and 3B.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 3A:
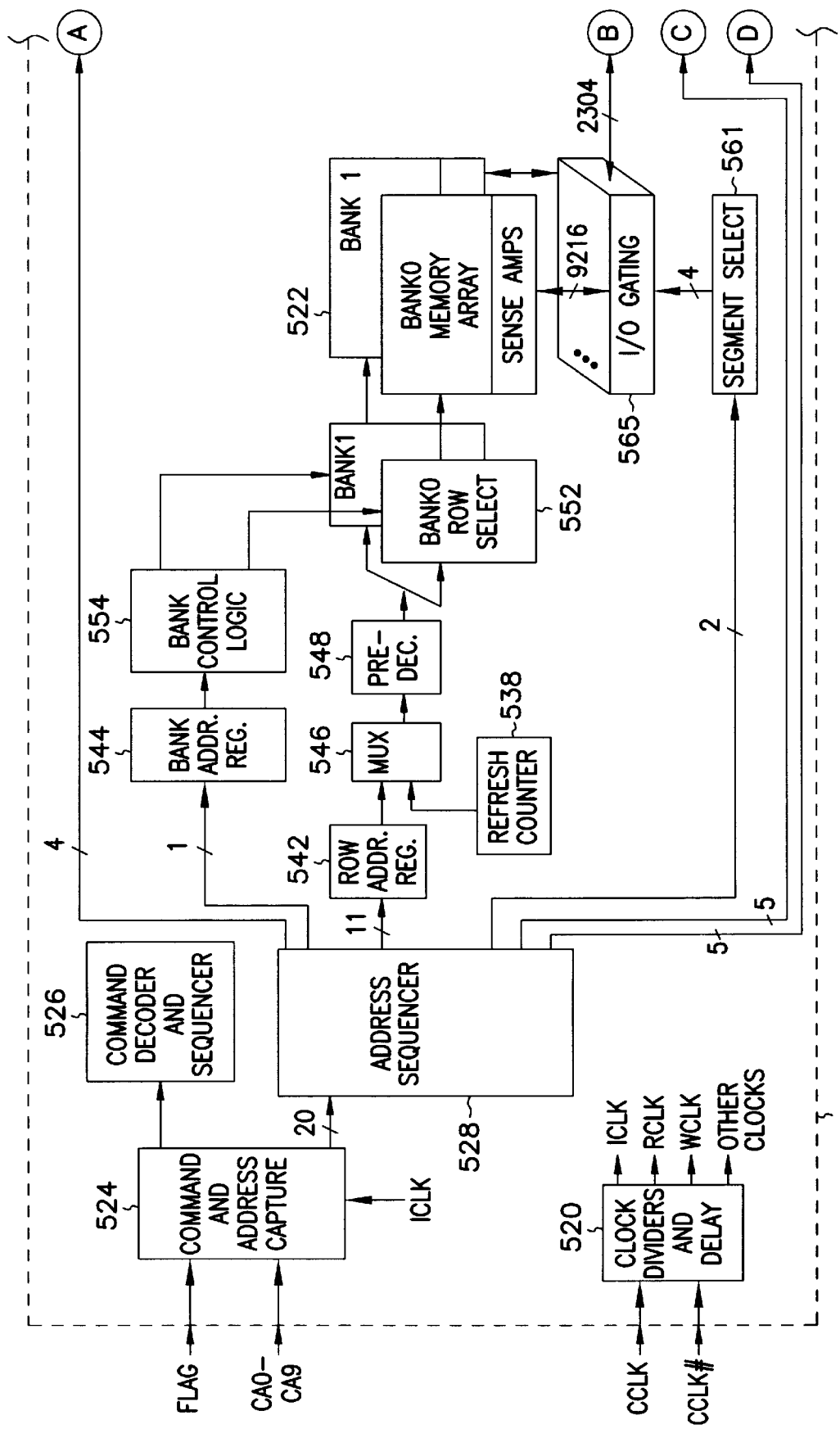
FIG. 3A is portion of a block diagram of an exemplary memory device containing intermediate storage and separate read and write I/O data paths.
Figure 3B:
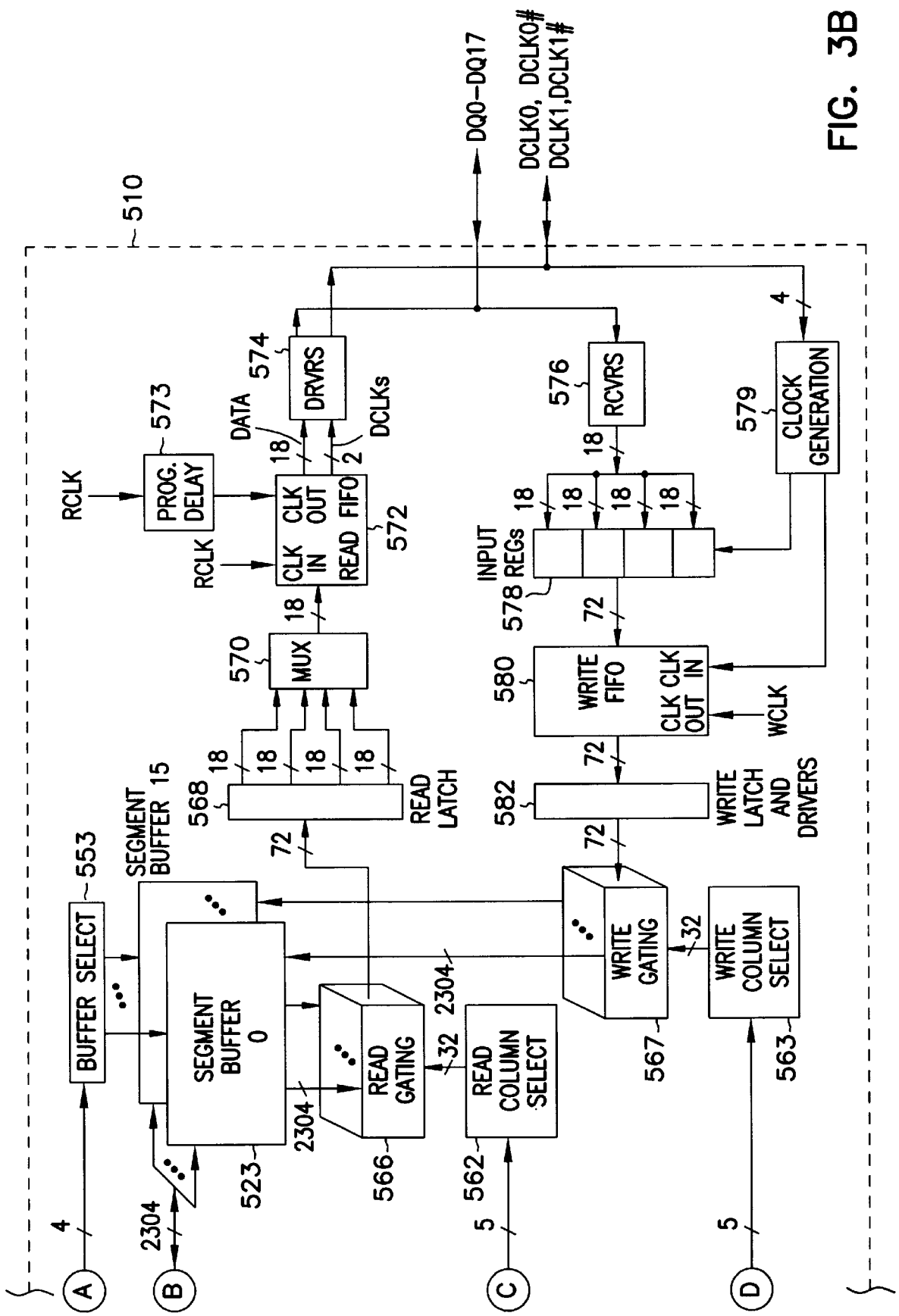
FIG. 3B is the remaining portion of the block diagram of FIG. 3A.

FIGS. 3A and 3B combined are a functional block diagram of one embodiment of a memory device 510. The memory device 510 is depicted as a 144M SLDRAM, although the discussion is generally applicable to other sizes, configurations and types of memory. Foreground read and write requests are directed to internal buffers, with the buffers performing read/write operations on the bank memory arrays in the background as required. For this discussion, page read/write requests will be referred to as buffer read/write requests when referring to the foreground operation directed to the internal buffers.

The memory device 510 includes bank memory arrays 522 which contain memory cells organized in rows and columns for storing data. Bank memory arrays 522 are depicted as two bank memory arrays, bank0 and bank1. In memory device 510, each bank memory array 522 is organized internally as 8192 rows by 4 segments by 32 columns by 72 bits. Those skilled in the art will recognize that different choices for the number of banks, rows, columns and segments, and the bit width, are possible without altering the fundamental operation of the memory devices described herein.

The memory device 510 further includes segment buffers 523. Segment buffers 523 provide the intermediate storage and act as cache memory, improving device response by reducing the need to access the bank memory arrays by temporarily storing frequently accessed data. Segment buffers 523 are depicted as 16 segment buffers, segment buffer0 through segment buffer15. In memory device 510, each segment buffer 523 is organized internally as 32 columns by 72 bits. Those skilled in the art will recognize that different choices for the number of segment buffers, columns and bit width are possible without altering the fundamental operation of the memory device described herein.

All access to data is directed to the segment buffers 523. Only when the requested data are not contained in segment buffers 523, as determined by the address bits contained in CA0–CA9 and caching techniques well known in the art, do the segment buffers 523 look to bank memory arrays 522 for the requested data.

Each segment buffer 523 retains a copy of the data stored in a portion of the memory cells of a bank memory array 522. The portion of data copied in each segment buffer 523 corresponds to one group of data for each column in the selected segment, in this case 32 columns×72 bits.

An external differential command clock (CCLK and CCLK#) signal is provided to clock dividers and delays 520 to generate clock signals ICLK (internal command clock), RCLK (read clock), WCLK (write clock) and other internal clock signals. Command input signals are effectively sampled at each crossing of internally delayed versions of CCLK/CCLK#.

A FLAG signal is supplied to command and address capture 524 to indicate that a valid request packet is available on pins CA0–CA9. Pins CA0—CA0 supply the address and command bits and may collectively be referred to as the command link. Command decoder and sequencer 526 acts to place the control logic in a particular command operation sequence according to the request packet received at command and address capture 524. Command decoder and sequencer 526 controls the various circuitry of memory device 510 based on decoded commands, such as during controlled reads to or writes from bank memory arrays 522. During write transfer operations, data is supplied to memory device 510 via input/output pins DQ0–DQ17. During read transfer operations, data is clocked out of memory device 510 via input/output pins DQ0–DQ17. The DQ pins can collectively (when looking external of the device) or individually (when looking internal of the device) be referred to as data links. For a read access, differential data clocks (DCLK0/DCLK0# and DCLK1/DCLK1#) are clocked out of memory device 510 via input/output pins DCLK0, DCLK0#, DCLK1 and DCLK1#. For a write access, differential data clocks (DCLK0/DCLK0# and DCLK1/DCLK1#) are driven externally, e.g. by a memory controller (not shown) and provided to memory device 510 via input/output pins DCLK0, DCLK0#, DCLK1 and DCLK1#.

Power-up and initialization functions of the memory device 510 are conducted in the conventional manner. Moreover, refresh functions of the memory device 510 are provided in the known manner employing a refresh counter 538 to refresh the memory arrays.

During a bank access command, address sequencer 528 generates a value representing the address of the selected bank memory array 522, as indicated by bank address bits on input pins CA0–CA9, and latches it in bank address register 544. Address sequencer 528 generates a value representing the segment address of the selected bank memory array, as indicated by segment address bits on input pins CA0–CA9, and latches it in segment select 561. Address sequencer 528 generates a value representing the buffer address of the selected segment buffer, as indicated by buffer address bits on input pins CA0–CA9, and latches it in buffer select 553. Address sequencer 528 further generates a value representing a row address of the selected bank memory array 522, as indicated by row address bits on input pins CA0–CA9, and latches it in a row address register 542. Address sequencer 528 still further generates a value representing a column address, as indicated by column address bits on input pins CA0–CA9, and latches it in read column select 562 and write column select 563.

The latched row address is provided to a row multiplexer 546 which provides a row address to predecoder 548 to be provided to bank row selects 552. In addition, bank address register 544 provides the latched bank address to bank control logic 554 which in turn provides a bank address to bank row selects 552. In response to the bank address and row address, bank row selects 552 activate the desired row of the desired memory bank for processing, to thereby activate the corresponding row of memory cells. Bank row selects 552 generally have a one-to-one relationship with bank memory arrays 522. In response to the segment address, segment select 561 activates 2,304 of the 4×32×72 (number of segments×number of columns×bit width) lines provided to sense amplifiers and I/O gating circuit 66, the number of lines activated corresponding to the number of columns times the bit width of the device. Each segment contains a group of 32 columns in memory device 510. Sense amplifiers associated with bank memory arrays 522 operate in a manner known in the art to sense the data stored in the memory cells addressed by the active bank row select line. The lines provided to sense amplifiers and I/O gating circuit 565 represent bidirectional data paths. Activating the segment select lines effectively couples the selected memory cells to the segment buffers 523 via the I/O gating circuit 565 and the 2,304 bidirectional data paths, the number of bidirectional data paths corresponding to the number of lines activated by segment select 561.

During buffer read command operations, buffer select 553 activates one segment buffer 523 for processing in response to the buffer address. Read column select 562, in response to the column address, activates 72 of the 32×72 lines (number of columns×bit width) provided to read gating circuit 566 from the selected segment buffer 523, the number of lines activated corresponding to the bit width of the device. Activating the lines effectively couples the selected buffers to read latch 568 via the read gating circuit 566. The lines provided to read gating circuit 566 represent unidirectional output data paths. Data is provided to read latch 568 from read gating circuit 566 as a 72-bit data word across 72 unidirectional data paths. Multiplexer 570 in turn provides the selected 72 bits of data to read FIFO 572 as a burst of four 18-bit data words, through methods such as time division multiplexing. The four data words are then driven sequentially to input/output pins DQ0–DQ17 by drivers 574. Data into read FIFO 572 is controlled by the RCLK signal generated by clock dividers and delays 520. Data out of read FIFO 572 is controlled by the delayed RCLK signal generated by programmable delay 573. Circuitry provided between DQ0–DQ17 and the read gating circuit 566 can collectively be referred to as output circuitry.

During buffer write command operations, buffer select 553 activates one segment buffer 523 for processing in response to the buffer address. Write column select 563, in response to the column address, activates 72 of the 32×72 (number of columns×bit width) lines provided to write gating circuit 567 from the selected segment buffer 523, the number of lines activated corresponding to the bit width of the device. Activating the lines effectively couples the write latch and drivers 582 to the selected buffers via the write gating circuit 567. The lines provided to write gating circuit 567 represent unidirectional input data paths. Data is provided on input/output pins DQ0–DQ17 to receivers 576 as a burst of four 18-bit data words which are individually stored in input registers 578. The four 18-bit words of input write data are provided to write FIFO 580 as a 72-bit data word and latched in write latch and drivers 582. Data into write FIFO 580 is controlled by clock generation 579 in response to external signals DCLK0/DCLK0# and DCLK1/DCLK1#. Data out of write FIFO 580 is controlled by the WCLK signal generated by clock dividers and delays 520. Write latch and drivers 582 provide the 72-bit data word across 72 unidirectional data paths to the selected buffer in a manner known in the art based on the activated 72 lines corresponding to the current column address. Circuitry provided between DQ0–DQ17 and the write gating circuit 567 can collectively be referred to as input circuitry.

For the background read operation on bank memory arrays 522, data is provided to the activated segment buffer 523 through I/O gating circuit 565 from the selected memory cells in a manner known in the art. For the background write operation on bank memory arrays 522, data is provided from the activated segment buffer 523 through the I/O gating circuit 565 to the selected memory cells in a manner known in the art.

Figure 1A:
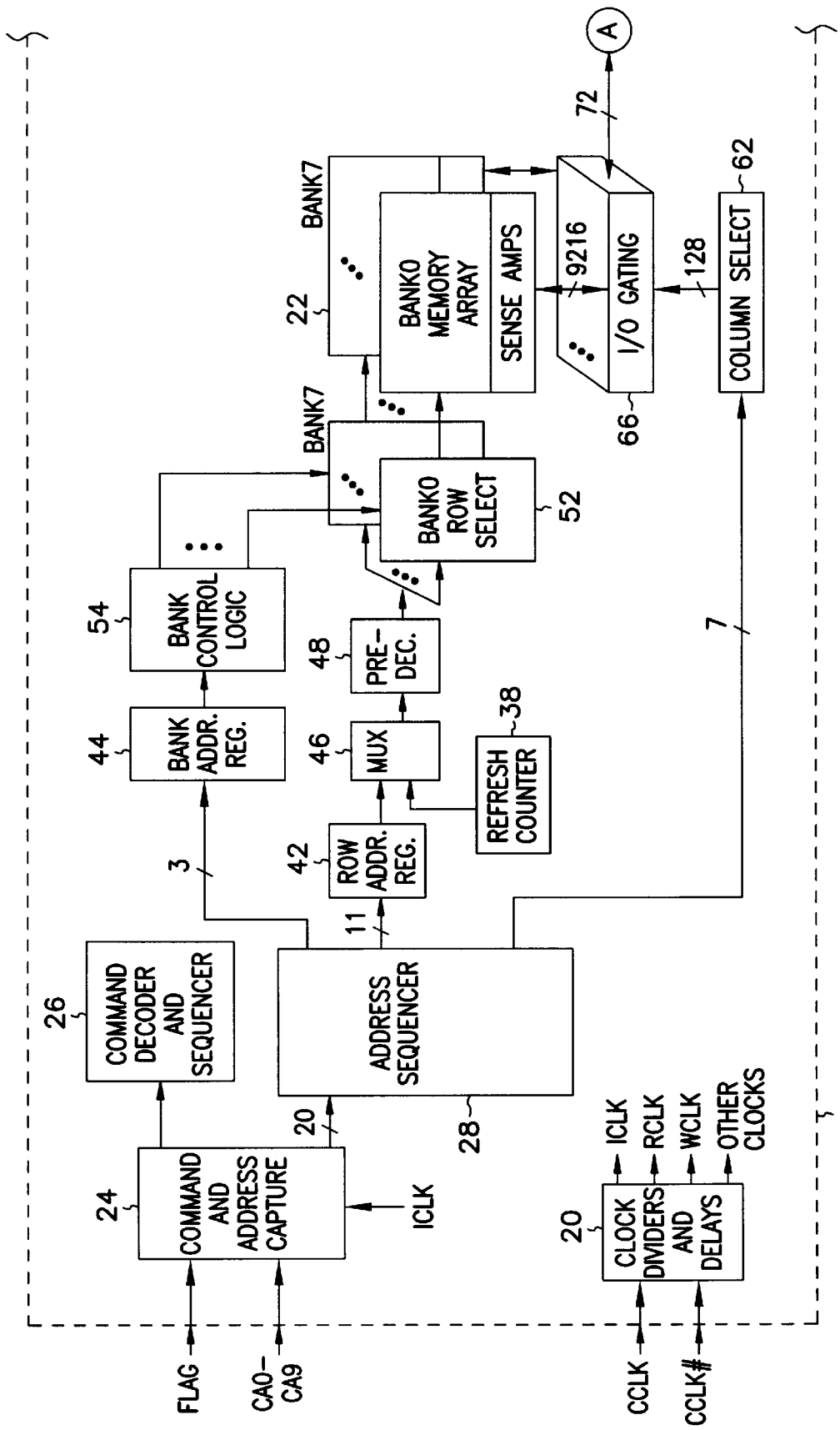
FIG. 1A is a portion of a block diagram of an existing memory device.
Figure 1B:
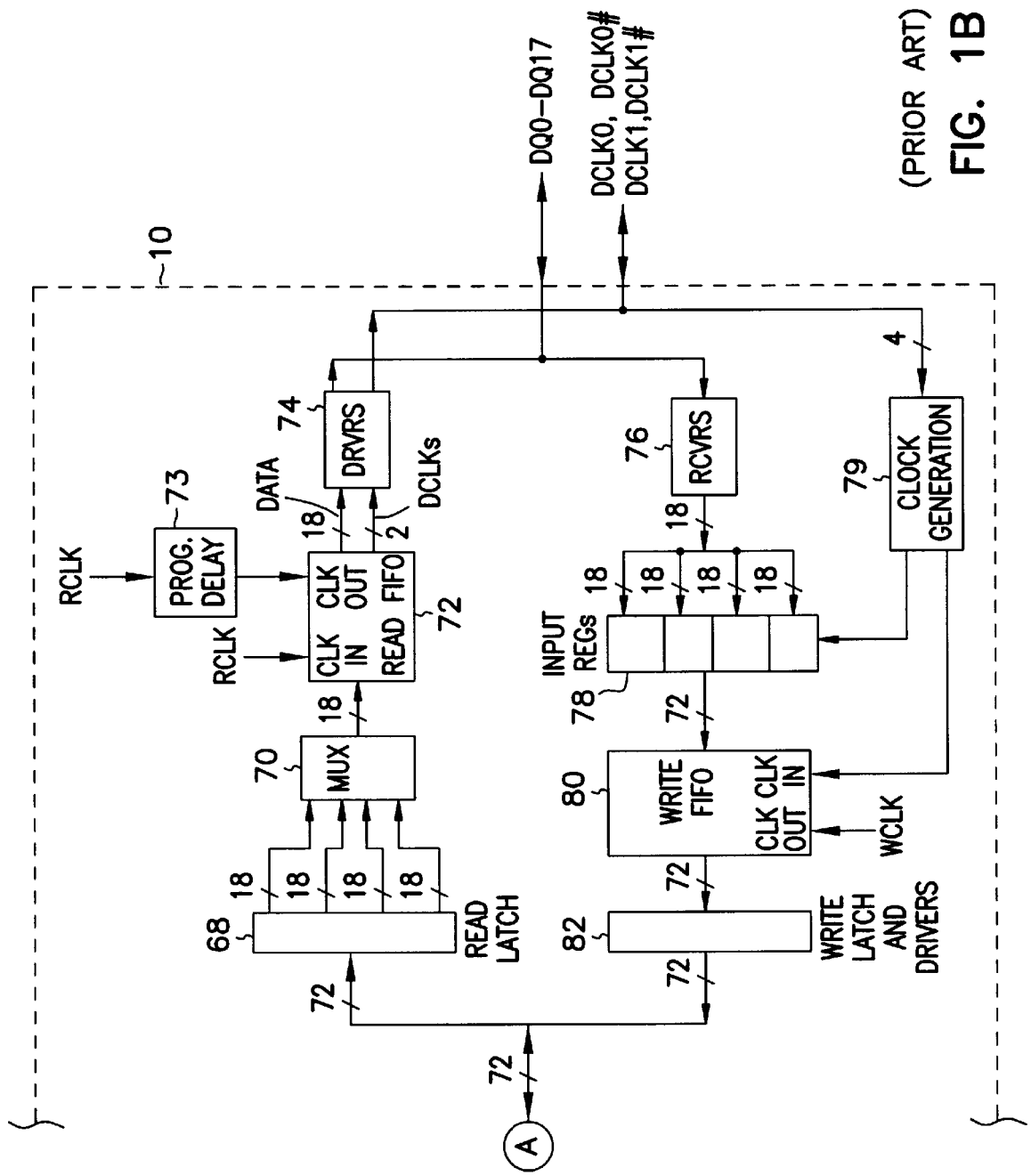
FIG. 1B is the remaining portion of the block diagram of FIG. 1A.
Figure 2:
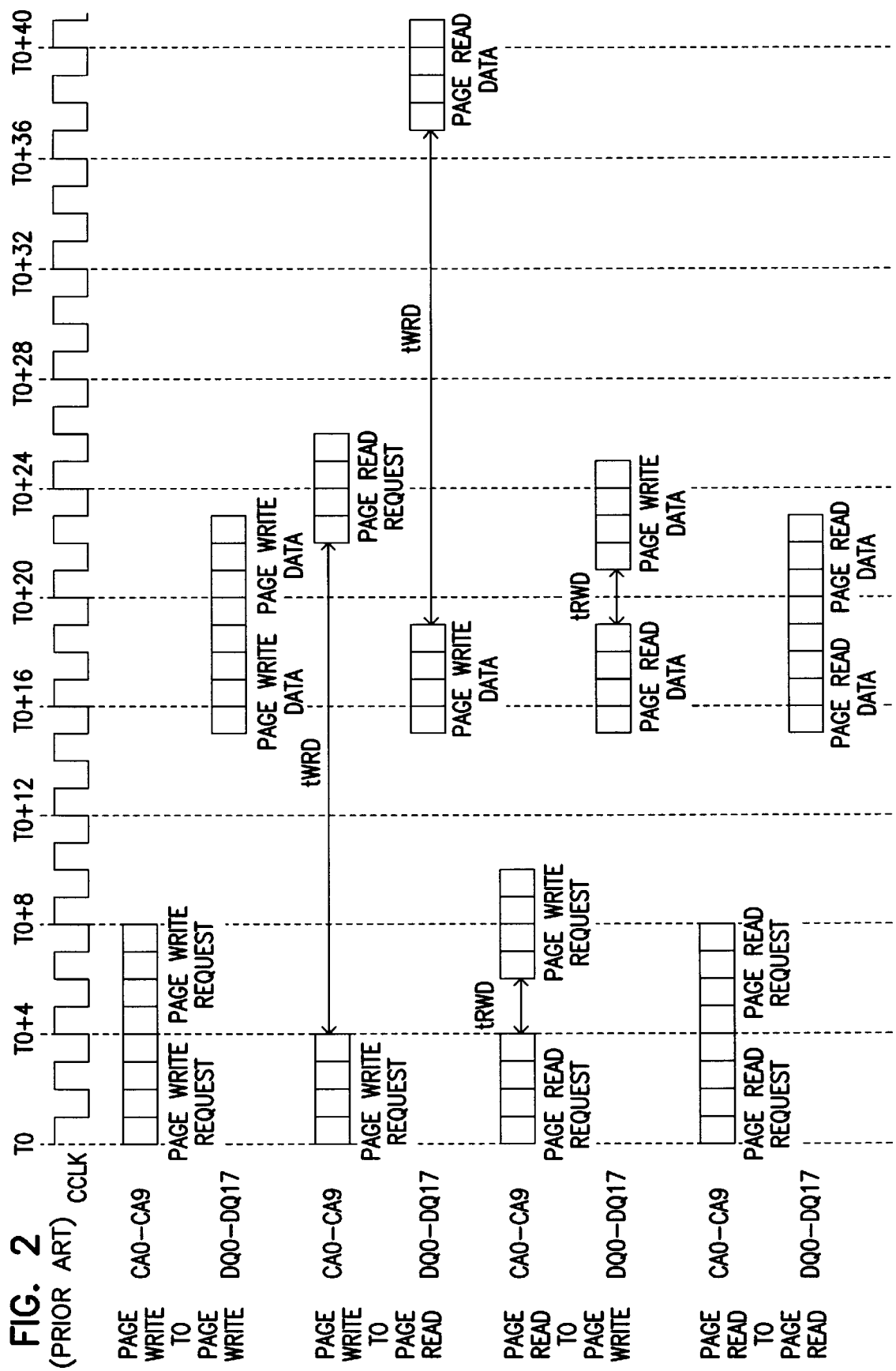
FIG. 2 is a timing diagram of the memory device of FIGS. 1A and 1B.

FIG. 4 depicts a timing diagram of the memory device 510 of FIGS. 3A and 3B in response to various requests. FIG. 4 is based on a time $t_0$ representing the time of the first request and a scale representing the number of clock ticks from time $t_0$, where there are two clock ticks for each clock cycle. As shown in FIG. 4, back-to-back buffer read requests and back-to-back buffer write requests can be accommodated similar to the back-to-back read/write requests with the memory device 10 of FIG. 1 and the memory device 310 of FIGS. 3A and 3B. Furthermore, transitioning from a buffer read request to a buffer write request still requires essentially the same latency $t_{RWD}$, i.e. generally two ticks. Memory device 510 retains the improved latency $t_{WRD}$ as obtained in the memory device 310. However, in memory device 510, duplicating the unidirectional data paths only as far as the segment buffers results in less complexity in the DRAM device due to a significant decrease in required lines in addition to obtaining the benefits of memory hierarchy.

As recognized by those skilled in the art, memory devices of the type described herein are generally fabricated as an integrated circuit containing a variety of semiconductor devices. The integrated circuit is supported by a substrate. A substrate is often a silicon wafer, but can additionally refer to silicon-on-insulator (SOI) technology, silicon-on-sapphire (SOS) technology, thin film transistor (TFT) technology and other applicable support structures. The integrated circuits are typically repeated multiple times on each substrate. The substrate is further processed to separate the integrated circuits into dies as is well known in the art.

Figure 5:
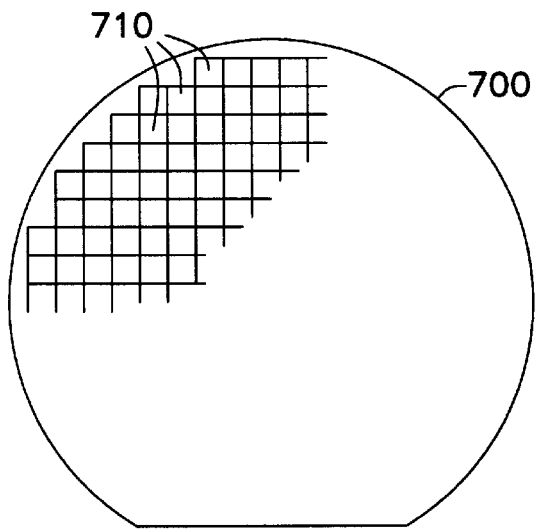
FIG. 5 is an elevation view of a substrate containing semiconductor dies.

With reference to FIG. 5, in one embodiment, a semiconductor die 710 is produced from a silicon wafer 700. A die is an individual pattern, typically rectangular, on a substrate that contains circuitry to perform a specific function. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Figure 6:
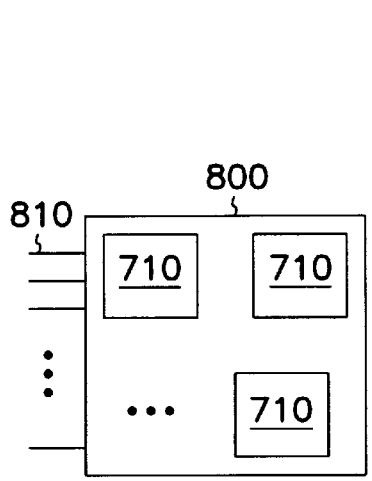
FIG. 6 is a block diagram of an exemplary circuit module.

As shown in FIG. 6, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom providing unilateral or bilateral communication and control.

Figure 7:
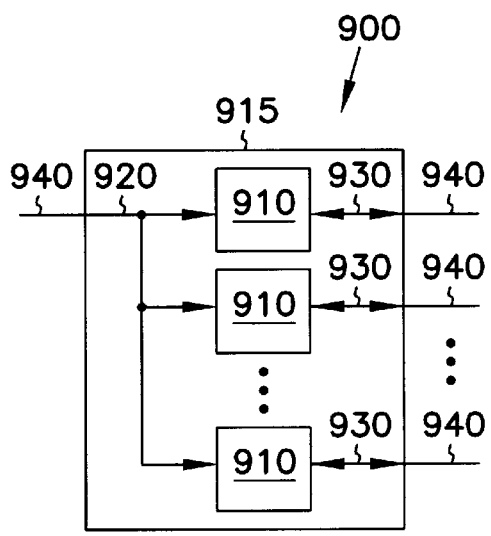
FIG. 7 is a block diagram of an exemplary memory module.

FIG. 7 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single inline set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 7.

Figure 8:
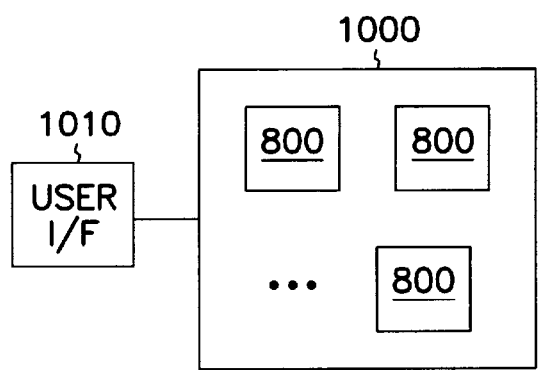
FIG. 8 is a block diagram of an exemplary electronic system.

FIG. 8 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 9:
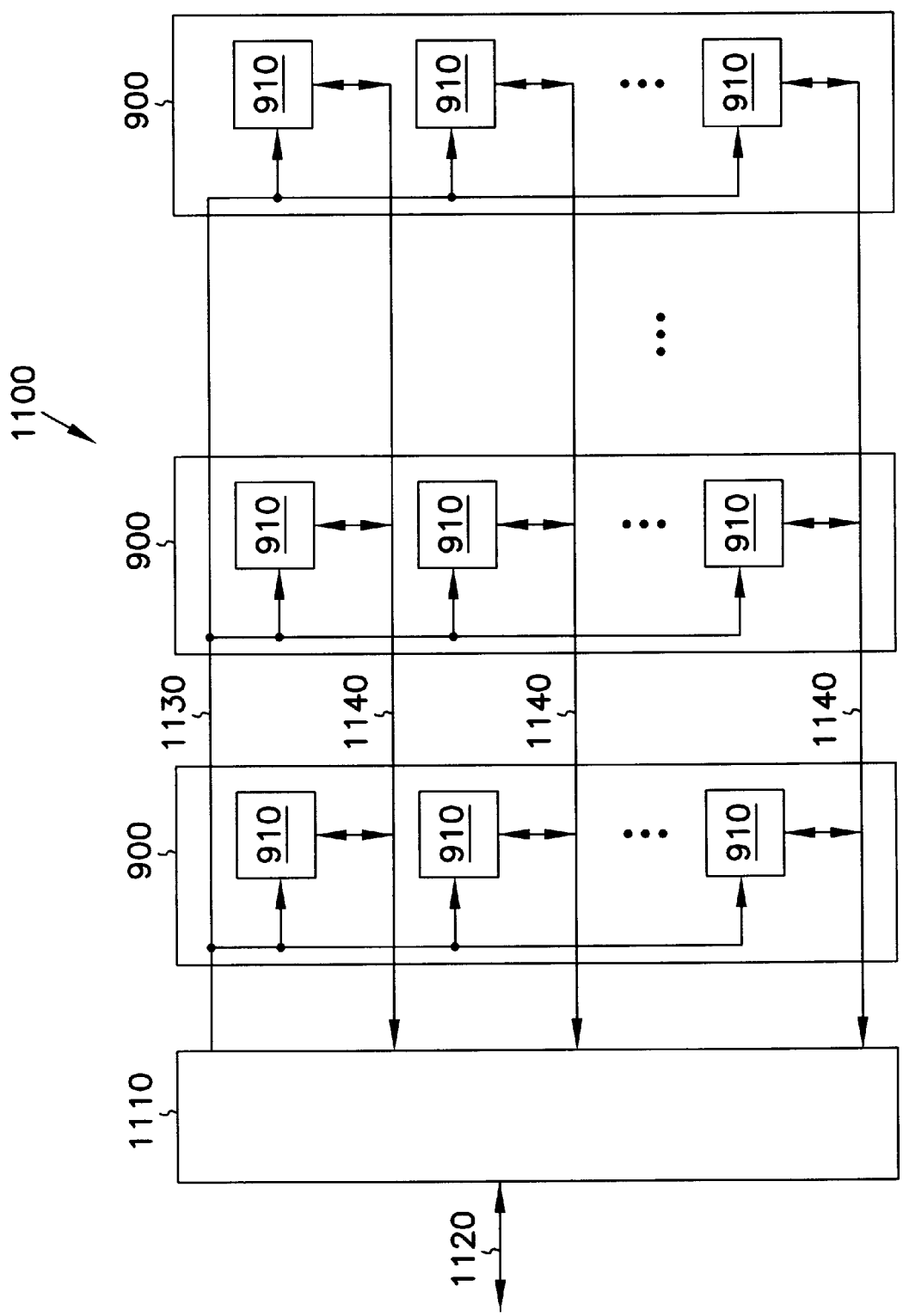
FIG. 9 is a block diagram of an exemplary memory system.

FIG. 9 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 10:
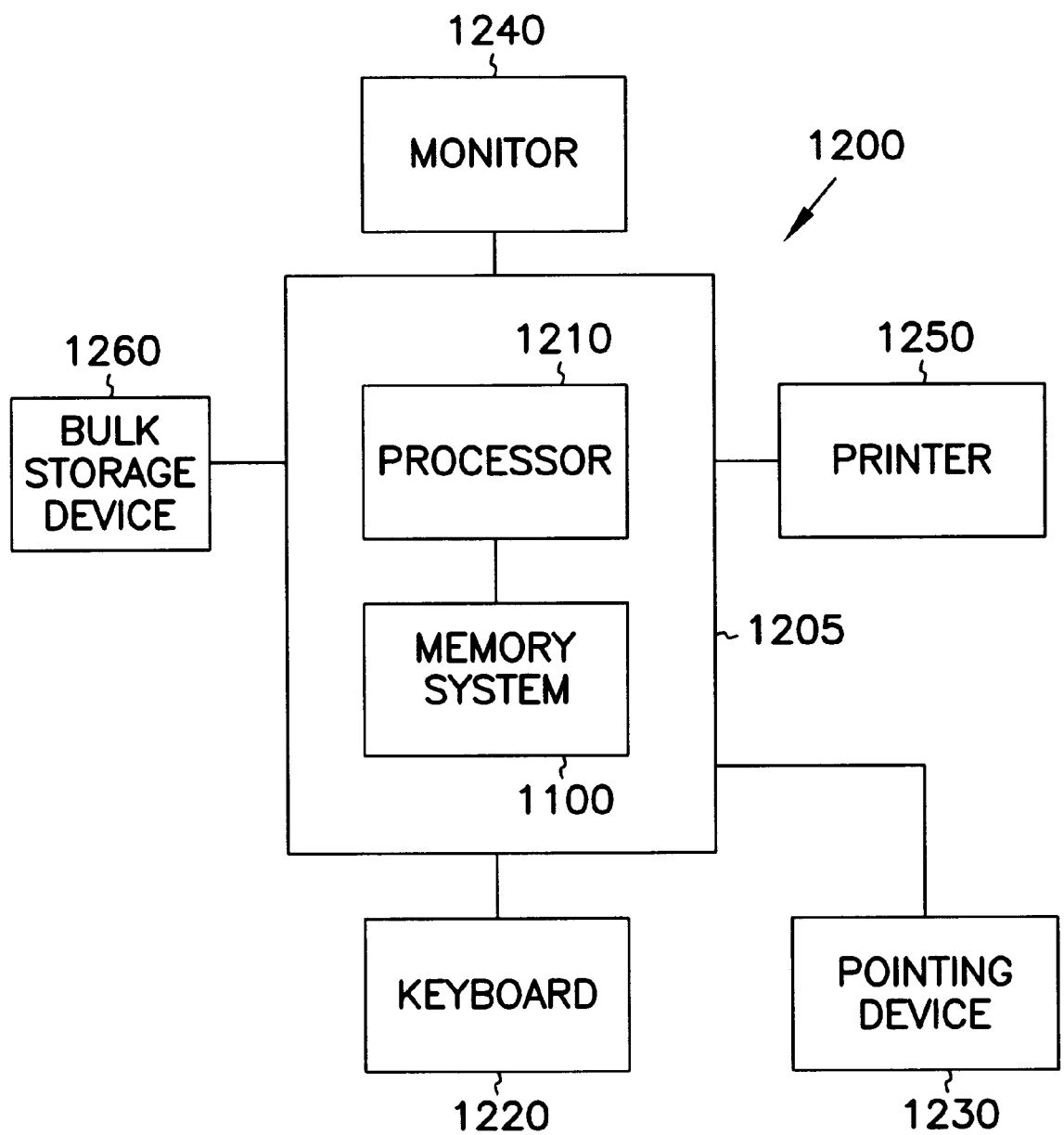
FIG. 10 is a block diagram of an exemplary computer system.

FIG. 10 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e. memory system 1100, as a subcomponent. Computer system 1200 optionally contains user interface components. Depicted in FIG. 10 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

A memory device has been described which includes intermediate storage, or cache, and unidirectional data paths internal to the memory device. The invention improves the response of the memory device by eliminating dual latencies associated with the transition from a write request to a read request.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, a variety of memory array sizes, types and configurations can be used, and any number of DQ lines can be used. Therefore, it is manifestly intended that this invention be limited only by the claims and the equivalents thereof.

What is claimed is:

1. A memory device, comprising:
   at least one memory array, wherein each at least one memory array contains a plurality of memory cells;
   at least one intermediate storage buffer;
   a plurality of bidirectional data links;
   a plurality of bidirectional data paths coupled between the at least one intermediate storage buffer and the at least one memory array;
   a plurality of unidirectional input data paths coupled between the plurality of bidirectional data links and the at least one intermediate storage buffer;
   a plurality of unidirectional output data paths coupled between the plurality of bidirectional data links and the at least one intermediate storage buffer; and
   an addressing circuitry capable of selectively coupling a portion of the plurality of unidirectional input data paths to the plurality of bidirectional data links.

2. A memory module, comprising:
   a support;
   a plurality of leads extending from the support;
   a command link coupled to at least one of the plurality of leads;

a plurality of data links, wherein each data link is coupled to at least one of the plurality of leads; and at least one memory device contained on the support and coupled to the command link, wherein the at least one memory device comprises:

at least one memory array;

at least one intermediate storage buffer;

a plurality of bidirectional data paths coupled between the at least one intermediate storage buffer and the at least one memory array;

a plurality of unidirectional input data paths coupled between the plurality of data links and the at least one intermediate storage buffer;

a plurality of unidirectional output data paths coupled between the plurality of data links and the at least one intermediate storage buffer; and an addressing circuitry capable of selectively coupling a portion of the plurality of unidirectional input data paths to the plurality of data links.

3. A memory device, comprising:

at least one memory array, wherein each at least one memory array contains a plurality of memory cells;

at least one intermediate storage buffer;

a first gating circuitry;

an input gating circuitry;

an output gating circuitry;

a plurality of bidirectional data links;

an input circuitry coupled to the plurality of bidirectional data links;

an output circuitry coupled to the plurality of bidirectional data links;

a first plurality of bidirectional data paths coupled between the first gating circuitry and the at least one memory array;

a second plurality of bidirectional data paths coupled between the at least one intermediate storage buffer and the first gating circuitry;

a first plurality of unidirectional input data paths coupled between the at least one intermediate storage buffer and the input gating circuitry;

a second plurality of unidirectional input data paths coupled between the input circuitry and the input gating circuitry;

a first plurality of unidirectional output data paths coupled between the at least one intermediate storage buffer and the output gating circuitry;

a second plurality of unidirectional output data paths coupled between the output circuitry and the output gating circuitry;

a first addressing circuitry capable of selectively activating a portion of the first plurality of bidirectional data paths to produce an activated portion of the first plurality of bidirectional data paths;

a second addressing circuitry capable of selectively activating a portion of the first plurality of unidirectional input data paths to produce an activated portion of the first plurality of unidirectional input data paths; and a third addressing circuitry capable of selectively activating a portion of the first plurality of unidirectional output data paths to produce an activated portion of the first plurality of unidirectional output data paths;

wherein the activated portion of the first plurality of bidirectional data paths are coupled to the second plurality of bidirectional data paths by the first gating circuitry, further wherein the activated portion of the first plurality of unidirectional input data paths is coupled to the second plurality of unidirectional input data paths by the input gating circuitry, still further wherein the activated portion of the first plurality of unidirectional output data paths is coupled to the second plurality of unidirectional output data paths by the output gating circuitry.

4. The memory device of claim 3, wherein the plurality of memory cells of each at least one memory array are organized as W rows by X segments by Y columns by Z bit width.

5. The memory device of claim 4, wherein the number of the first plurality of bidirectional data paths is equal to X times Y times Z times the number of the at least one memory arrays.

6. The memory device of claim 4, wherein the number of the second plurality of bidirectional data paths is equal to Y times Z times the number of the at least one intermediate storage buffers.

7. The memory device of claim 4, wherein the number of the first plurality of unidirectional input data paths and the number of the first plurality of unidirectional output data paths are each equal to Y times Z times the number of the at least one intermediate storage buffers.

8. The memory device of claim 4, wherein the number of the second plurality of unidirectional input data paths and the number of the second plurality of unidirectional output data paths are each equal to Z.

9. The memory device of claim 4, wherein Z is some multiple of the number of the bidirectional data links.

10. A method of reading data from a memory device having a plurality of memory cells, comprising:

selecting a portion of the plurality of memory cells in response to a request to read data from the memory device, thereby producing a selected portion of the plurality of memory cells;

coupling the selected portion of the plurality of memory cells to a plurality of bidirectional data paths;

coupling the plurality of bidirectional data paths to an intermediate storage buffer;

coupling the intermediate storage buffer to a plurality of unidirectional data paths;

copying data stored in the selected portion of the plurality of memory cells to the intermediate storage buffer via the plurality of bidirectional data paths, thereby producing a copy of the data; and reading at least a portion of the copy of the data via the plurality of unidirectional data paths.

11. A semiconductor die, comprising:

a substrate; and an integrated circuit supported by the substrate, wherein the integrated circuit comprises at least one memory device, further wherein the at least one memory device comprises:

at least one memory array, wherein each at least one memory array contains a plurality of memory cells;

at least one intermediate storage buffer;

a plurality of bidirectional data links;

a plurality of bidirectional data paths coupled between the at least one intermediate storage buffer and the at least one memory array;

a plurality of unidirectional input data paths coupled between the at least one intermediate storage buffer and the plurality of bidirectional data links;

a plurality of unidirectional output data paths coupled between the at least one intermediate storage buffer and the plurality of bidirectional data links; and addressing and gating circuitry, wherein the addressing and gating circuitry is capable of selectively coupling a portion of the plurality of bidirectional data paths to the at least one intermediate storage buffer, further wherein the addressing and gating circuitry is capable of selectively coupling a portion of the plurality of unidirectional input data paths to the plurality of bidirectional data links, still further wherein the addressing and gating circuitry is capable of selectively coupling a portion of the plurality of unidirectional output data paths to the plurality of bidirectional data links.

12. A semiconductor die, comprising:
a substrate; and
an integrated circuit supported by the substrate, wherein the integrated circuit comprises at least one memory device, further wherein the at least one memory device comprises:
  at least one memory array, wherein each at least one memory array contains a plurality of memory cells;
  at least one intermediate storage buffer;
  a first gating circuitry;
  an input gating circuitry;
  an output gating circuitry;
  a plurality of bidirectional data links;
  an input circuitry coupled to the plurality of bidirectional data links;
  an output circuitry coupled to the plurality of bidirectional data links;
  a first plurality of bidirectional data paths coupled between the first gating circuitry and the at least one memory array;
  a second plurality of bidirectional data paths coupled between the at least one intermediate storage buffer and the first gating circuitry;
  a first plurality of unidirectional input data paths coupled between the at least one intermediate storage buffer and the input gating circuitry;
  a second plurality of unidirectional input data paths coupled between the input circuitry and the input gating circuitry;
  a first plurality of unidirectional output data paths coupled between the at least one intermediate storage buffer and the output gating circuitry;
  a second plurality of unidirectional output data paths coupled between the output circuitry and the output gating circuitry;
  a first addressing circuitry capable of selectively activating a portion of the first plurality of bidirectional data paths to produce an activated portion of the first plurality of bidirectional data paths;
  a second addressing circuitry capable of selectively activating a portion of the first plurality of unidirectional input data paths to produce an activated portion of the first plurality of unidirectional input data paths; and
  a third addressing circuitry capable of selectively activating a portion of the first plurality of unidirectional output data paths to produce an activated portion of the first plurality of unidirectional output data paths;
  wherein the activated portion of the first plurality of bidirectional data paths are coupled to the second plurality of bidirectional data paths by the first gating circuitry, further wherein the activated portion of the first plurality of unidirectional input data paths is coupled to the second plurality of unidirectional input data paths by the input gating circuitry, still further wherein the activated portion of the first plurality of unidirectional output data paths is coupled to the second plurality of unidirectional output data paths by the output gating circuitry.

13. The semiconductor die of claim 12, wherein the plurality of memory cells of each at least one memory array are organized as W rows by X segments by Y columns by Z bit width.

14. The semiconductor die of claim 13, wherein the number of the first plurality of bidirectional data paths is equal to X times Y times Z times the number of the at least one memory arrays.

15. The semiconductor die of claim 13, wherein the number of the second plurality of bidirectional data paths is equal to Y times Z times the number of the at least one intermediate storage buffers.

16. The semiconductor die of claim 13, wherein the number of the first plurality of unidirectional input data paths and the number of the first plurality of unidirectional output data paths are each equal to Y times Z times the number of the at least one intermediate storage buffers.

17. The semiconductor die of claim 13, wherein the number of the second plurality of unidirectional input data paths and the number of the second plurality of unidirectional output data paths are each equal to Z.

18. The semiconductor die of claim 13, wherein Z is some multiple of the number of the bidirectional data links.

19. A memory module, comprising:
a support;
a plurality of leads extending from the support;
a command link coupled to at least one of the plurality of leads;
a plurality of data links, wherein each data link is coupled to at least one of the plurality of leads; and
at least one memory device contained on the support and coupled to the command link, wherein the at least one memory device comprises:
  at least one memory array;
  at least one intermediate storage buffer;
  a plurality of bidirectional data paths coupled between the at least one intermediate storage buffer and the at least one memory array;
  a plurality of unidirectional input data paths coupled between the plurality of data links and the at least one intermediate storage buffer; and
  a plurality of unidirectional output data paths coupled between the plurality of data links and the at least one intermediate storage buffer.

20. A memory module, comprising:
a support;
a plurality of leads extending from the support;
a command link coupled to at least one of the plurality of leads;
a plurality of data links, wherein each data link is coupled to at least one of the plurality of leads; and
at least one memory device contained on the support and coupled to the command link, wherein the at least one memory device comprises:
  at least one memory array;
  at least one intermediate storage buffer;
  a plurality of bidirectional data paths coupled between the at least one intermediate storage buffer and the at least one memory array;
  a plurality of unidirectional input data paths coupled between the at least one intermediate storage buffer and the plurality of data links;

a plurality of unidirectional output data paths coupled between the at least one intermediate storage buffer and the plurality of data links; and addressing and gating circuitry, wherein the addressing and gating circuitry is capable of selectively coupling a portion of the plurality of bidirectional data paths to the at least one intermediate storage buffer, further wherein the addressing and gating circuitry is capable of selectively coupling a portion of the plurality of unidirectional input data paths to the plurality of data links, still further wherein the addressing and gating circuitry is capable of selectively coupling a portion of the plurality of unidirectional output data paths to the plurality of data links.

21. A memory module, comprising:

a support;

a plurality of leads extending from the support;

a command link coupled to at least one of the plurality of leads;

a plurality of data links, wherein each data link is coupled to at least one of the plurality of leads; and at least one memory device contained on the support and coupled to the command link, wherein the at least one memory device comprises:
at least one memory array;
at least one intermediate storage buffer;
a first gating circuitry;
an input gating circuitry;
an output gating circuitry;
an input circuitry coupled to the plurality of data links;
an output circuitry coupled to the plurality of data links;
a first plurality of bidirectional data paths coupled between the first gating circuitry and the at least one memory array;
a second plurality of bidirectional data paths coupled between the at least one intermediate storage buffer and the first gating circuitry;
a first plurality of unidirectional input data paths coupled between the at least one intermediate storage buffer and the input gating circuitry;
a second plurality of unidirectional input data paths coupled between the input circuitry and the input gating circuitry;
a first plurality of unidirectional output data paths coupled between the at least one intermediate storage buffer and the output gating circuitry;
a second plurality of unidirectional output data paths coupled between the output circuitry and the output gating circuitry;
a first addressing circuitry capable of selectively activating a portion of the first plurality of bidirectional data paths to produce an activated portion of the first plurality of bidirectional data paths;
a second addressing circuitry capable of selectively activating a portion of the first plurality of unidirectional input data paths to produce an activated portion of the first plurality of unidirectional input data paths; and
a third addressing circuitry capable of selectively activating a portion of the first plurality of unidirectional output data paths to produce an activated portion of the first plurality of unidirectional output data paths;
wherein the activated portion of the first plurality of bidirectional data paths are coupled to the second plurality of bidirectional data paths by the first gating circuitry, further wherein the activated portion of the first plurality of unidirectional input data paths is coupled to the second plurality of unidirectional input data paths by the input gating circuitry, still further wherein the activated portion of the first plurality of unidirectional output data paths is coupled to the second plurality of unidirectional output data paths by the output gating circuitry.

22. The memory module of claim 21, wherein the plurality of memory cells of each at least one memory array are organized as W rows by X segments by Y columns by Z bit width.

23. The memory module of claim 22, wherein the number of the first plurality of bidirectional data paths is equal to X times Y times Z times the number of the at least one memory arrays.

24. The memory module of claim 22, wherein the number of the second plurality of bidirectional data paths is equal to times Z times the number of the at least one intermediate storage buffers.

25. The memory module of claim 22, wherein the number of the first plurality of unidirectional input data paths and the number of the first plurality of unidirectional output data paths are each equal to Y times Z times the number of the at least one intermediate storage buffers.

26. The memory module of claim 22, wherein the number of the second plurality of unidirectional input data paths and the number of the second plurality of unidirectional output data paths are each equal to Z.

27. A memory system, comprising:

a controller;

a command link coupled to the controller;

a data link coupled to the controller; and a memory device coupled to the command link and the data link, wherein the memory device comprises:
a memory array;
an intermediate storage buffer;
a plurality of bidirectional data paths coupled between the intermediate storage buffer and the memory array;
a plurality of unidirectional input data paths coupled between the data link and the intermediate storage buffer;
a plurality of unidirectional output data paths coupled between the data link and the intermediate storage buffer; and
an addressing circuitry capable of selectively coupling a portion of the plurality of unidirectional input data paths to the data link.

28. A memory system, comprising:

a controller;

a command link coupled to the controller;

a data link coupled to the controller; and a memory device coupled to the command link and the data link, wherein the memory device comprises:
a memory array;
an intermediate storage buffer;
a plurality of bidirectional data paths coupled between the intermediate storage buffer and the memory array;
a plurality of unidirectional input data paths coupled between the intermediate storage buffer and the data link;
a plurality of unidirectional output data paths coupled between the intermediate storage buffer and the data link; and addressing and gating circuitry, wherein the addressing and gating circuitry is capable of selectively coupling a portion of the plurality of bidirectional data paths to the intermediate storage buffer, further wherein the addressing and gating circuitry is capable of selectively coupling a portion of the plurality of unidirectional input data paths to the data link, still further wherein the addressing and gating circuitry is capable of selectively coupling a portion of the plurality of unidirectional output data paths to the data link.

29. A memory system, comprising:

a controller;

a command link coupled to the controller;

a data link coupled to the controller; and a memory device coupled to the command link and the data link, wherein the memory device comprises:
- a plurality of memory arrays, wherein each of the plurality of memory arrays contains a plurality of memory cells;
- a plurality of intermediate storage buffers;
- a plurality of bidirectional data paths coupled between the plurality of intermediate storage buffers and the plurality of memory arrays;
- a plurality of unidirectional input data paths coupled between the data link and the plurality of intermediate storage buffers;
- a plurality of unidirectional output data paths coupled between the data link and the plurality of intermediate storage buffers; and
- addressing and gating circuitry, wherein the addressing and gating circuitry is capable of selectively coupling a portion of the plurality of bidirectional data paths to the plurality of intermediate storage buffers, further wherein the addressing and gating circuitry is capable of selectively coupling a portion of the plurality of unidirectional input data paths to the data link, still further wherein the addressing and gating circuitry is capable of selectively coupling a portion of the plurality of unidirectional output data paths to the data link.

30. A memory system, comprising:

a controller;

a command link coupled to the controller;

a data link coupled to the controller; and a memory device coupled to the command link and the data link, wherein the memory device comprises:
- at least one memory array, wherein each at least one memory array contains a plurality of memory cells;
- at least one intermediate storage buffer;
- a first gating circuitry;
- an input gating circuitry;
- an output gating circuitry;
- an input circuitry coupled to the data link;
- an output circuitry coupled to the data link;
- a first plurality of bidirectional data paths coupled between the first gating circuitry and the at least one memory array;
- a second plurality of bidirectional data paths coupled between the at least one intermediate storage buffer and the first gating circuitry;
- a first plurality of unidirectional input data paths coupled between the at least one intermediate storage buffer and the input gating circuitry;
- a second plurality of unidirectional input data paths coupled between the input circuitry and the input gating circuitry;
- a first plurality of unidirectional output data paths coupled between the at least one intermediate storage buffer and the output gating circuitry;
- a second plurality of unidirectional output data paths coupled between the output circuitry and the output gating circuitry;
- a first addressing circuitry capable of selectively activating a portion of the first plurality of bidirectional data paths to produce an activated portion of the first plurality of bidirectional data paths;
- a second addressing circuitry capable of selectively activating a portion of the first plurality of unidirectional input data paths to produce an activated portion of the first plurality of unidirectional input data paths; and
- a third addressing circuitry capable of selectively activating a portion of the first plurality of unidirectional output data paths to produce an activated portion of the first plurality of unidirectional output data paths;
- wherein the activated portion of the first plurality of bidirectional data paths are coupled to the second plurality of bidirectional data paths by the first gating circuitry, further wherein the activated portion of the first plurality of unidirectional input data paths is coupled to the second plurality of unidirectional input data paths by the input gating circuitry, still further wherein the activated portion of the first plurality of unidirectional output data paths is coupled to the second plurality of unidirectional output data paths by the output gating circuitry.

31. An electronic system, comprising:

a processor; and at least one memory device coupled to the processor, wherein the at least one memory device comprises:
- at least one memory array, wherein each at least one memory array contains a plurality of memory cells;
- at least one intermediate storage buffer;
- a command link coupled to the processor;
- a plurality of bidirectional data links;
- a plurality of bidirectional data paths coupled between the at least one intermediate storage buffer and the at least one memory array;
- a plurality of first unidirectional data paths coupled between the plurality of bidirectional data links and the at least one intermediate storage buffer; and
- a plurality of second unidirectional data paths coupled between the plurality of bidirectional data links and the at least one intermediate storage buffer.

32. An electronic system, comprising:

a processor; and at least one memory device coupled to the processor, wherein the at least one memory device comprises:
- at least one memory array, wherein each at least one memory array contains a plurality of memory cells;
- at least one intermediate storage buffer;
- a command link coupled to the processor, wherein the command link supplies command and address bits to the memory device;
- a plurality of bidirectional data links;
- a plurality of bidirectional data paths coupled between the at least one intermediate storage buffer and the at least one memory array;
- a plurality of unidirectional input data paths coupled between the at least one intermediate storage buffer and the plurality of bidirectional data links;
- a plurality of unidirectional output data paths coupled between the at least one intermediate storage buffer and the plurality of bidirectional data links; and addressing and gating circuitry responsive to the command and address bits, wherein the addressing and gating circuitry is capable of selectively coupling a portion of the plurality of bidirectional data paths to the at least one intermediate storage buffer, further wherein the addressing and gating circuitry is capable of selectively coupling a portion of the plurality of unidirectional input data paths to the plurality of bidirectional data links, still further wherein the addressing and gating circuitry is capable of selectively coupling a portion of the plurality of unidirectional output data paths to the plurality of bidirectional data links.

33. An electronic system, comprising:

a processor; and at least one memory device coupled to the processor, wherein the at least one memory device comprises:
- at least one memory array, wherein each at least one memory array contains a plurality of memory cells;
- at least one intermediate storage buffer;
- a first gating circuitry;
- an input gating circuitry;
- an output gating circuitry;
- a command link coupled to the processor, wherein the command link supplies command and address bits to the memory device;
- a plurality of bidirectional data links;
- an input circuitry coupled to the plurality of bidirectional data links;
- an output circuitry coupled to the plurality of bidirectional data links;
- a first plurality of bidirectional data paths coupled between the first gating circuitry and the at least one memory array;
- a second plurality of bidirectional data paths coupled between the at least one intermediate storage buffer and the first gating circuitry;
- a first plurality of unidirectional input data paths coupled between the at least one intermediate storage buffer and the input gating circuitry;
- a second plurality of unidirectional input data paths coupled between the input circuitry and the input gating circuitry;
- a first plurality of unidirectional output data paths coupled between the at least one intermediate storage buffer and the output gating circuitry;
- a second plurality of unidirectional output data paths coupled between the output circuitry and the output gating circuitry;
- a first addressing circuitry responsive to the command and address bits and capable of selectively activating a portion of the first plurality of bidirectional data paths to produce an activated portion of the first plurality of bidirectional data paths;
- a second addressing circuitry responsive to the command and address bits and capable of selectively activating a portion of the first plurality of unidirectional input data paths to produce an activated portion of the first plurality of unidirectional input data paths; and
- a third addressing circuitry responsive to the command and address bits and capable of selectively activating a portion of the first plurality of unidirectional output data paths to produce an activated portion of the first plurality of unidirectional output data paths;

wherein the activated portion of the first plurality of bidirectional data paths are coupled to the second plurality of bidirectional data paths by the first gating circuitry, further wherein the activated portion of the first plurality of unidirectional input data paths is coupled to the second plurality of unidirectional input data paths by the input gating circuitry, still further wherein the activated portion of the first plurality of unidirectional output data paths is coupled to the second plurality of unidirectional output data paths by the output gating circuitry.

* * * * *